(12) United States Patent
Chiu et al.

(10) Patent No.: US 9,502,377 B2
(45) Date of Patent: Nov. 22, 2016

(54) SEMICONDUCTOR PACKAGE AND FABRICATION METHOD THEREOF

(71) Applicant: Siliconware Precision Industries Co., Ltd., Taichung (TW)

(72) Inventors: Chih-Hsien Chiu, Taichung Hsien (TW); Tsung-Hsien Tsai, Taichung Hsien (TW); Chao-Ya Yang, Taichung Hsien (TW); Chia-Yang Chen, Taichung Hsien (TW); Chih-Ming Cheng, Taichung Hsien (TW); Yude Chu, Taichung Hsien (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 13/971,189

(22) Filed: Aug. 20, 2013

(65) Prior Publication Data

US 2014/0353850 A1 Dec. 4, 2014

(30) Foreign Application Priority Data

May 28, 2013 (TW) .............................. 102118734 A

(51) Int. Cl.
*H01L 23/48* (2006.01)
*H01L 23/52* (2006.01)
(Continued)

(52) U.S. Cl.
CPC ........... *H01L 24/85* (2013.01); *H01L 23/4334* (2013.01); *H01L 24/32* (2013.01); *H01L 24/48* (2013.01); *H01L 25/0657* (2013.01); *H01L 23/3121* (2013.01); *H01L 23/552* (2013.01); *H01L 23/66* (2013.01); *H01L 24/73* (2013.01); *H01L 2224/04042* (2013.01); *H01L 2224/2919* (2013.01); *H01L 2224/32014* (2013.01); *H01L 2224/32145* (2013.01); *H01L 2224/32225* (2013.01); *H01L 2224/48091* (2013.01); *H01L 2224/48145* (2013.01); *H01L 2224/48227* (2013.01); *H01L 2224/73265* (2013.01); *H01L 2224/83191* (2013.01); *H01L 2224/8592* (2013.01); *H01L 2224/92247* (2013.01); *H01L 2225/0651* (2013.01);
(Continued)

(58) Field of Classification Search
CPC ..................... H01L 23/02; H01L 2224/73265; H01L 2924/00012; H01L 2224/48227; H01L 2224/04042; H01L 2224/32014; H01L 2225/0651; H01L 23/66
USPC ......... 257/686, 770, 777; 438/109, 118, 200
See application file for complete search history.

(56) References Cited

U.S. PATENT DOCUMENTS 6,005,778 A * 12/1999 Spielberger et al. ......... 361/770
6,853,064 B2 * 2/2005 Bolken ................. H01L 21/565
                                                            257/685
(Continued)

*Primary Examiner* — John C Ingham
*Assistant Examiner* — Ismail Muse
(74) *Attorney, Agent, or Firm* — Mintz Levin Cohn Ferris Glovsky and Popeo, P.C.; Peter F. Corless; Steven M. Jensen

(57) ABSTRACT

A semiconductor package is disclosed, which includes: a circuit board; a carrier disposed on the circuit board; an RF chip disposed on the carrier; a plurality of high level bonding wires electrically connecting electrode pads of the RF chip and the circuit board; and an encapsulant formed on the circuit board for encapsulating the carrier, the high level bonding wires and the RF chip. The present invention positions the RF chip at a high level so as to facilitate element arrangement and high frequency wiring on the circuit board, thereby achieving a highly integrated wireless SiP (System in Package) module.

11 Claims, 3 Drawing Sheets

(51) Int. Cl.
  *H01L 29/40*   (2006.01)
  *H01L 23/00*   (2006.01)
  *H01L 23/433*  (2006.01)
  *H01L 25/065*  (2006.01)
  *H01L 23/31*    (2006.01)
  *H01L 23/552*   (2006.01)
  *H01L 23/66*    (2006.01)

(52) U.S. Cl.
  CPC ............ *H01L 2225/06575* (2013.01); *H01L 2924/00014* (2013.01); *H01L 2924/181* (2013.01); *H01L 2924/19041* (2013.01); *H01L 2924/19042* (2013.01); *H01L 2924/19043* (2013.01); *H01L 2924/19103* (2013.01); *H01L 2924/19104* (2013.01); *H01L 2924/19105* (2013.01)

(56) References Cited

U.S. PATENT DOCUMENTS

| | | | |
|---|---|---|---|
| 7,675,180 B1* | 3/2010 | St. Amand et al. | 257/777 |
| 2003/0038374 A1* | 2/2003 | Shim et al. | 257/777 |
| 2006/0043559 A1* | 3/2006 | Chow et al. | 257/686 |
| 2006/0197207 A1* | 9/2006 | Chow | H01L 23/49575 257/686 |
| 2007/0007643 A1* | 1/2007 | Oh | H01L 23/49827 257/701 |
| 2007/0102802 A1* | 5/2007 | Kang et al. | 257/686 |
| 2007/0170570 A1* | 7/2007 | Camacho | H01L 23/3107 257/686 |
| 2007/0194424 A1* | 8/2007 | Camacho | H01L 25/03 257/686 |
| 2008/0044947 A1* | 2/2008 | Lam | H01L 23/49575 438/109 |
| 2008/0093723 A1* | 4/2008 | Myers et al. | 257/686 |
| 2008/0122059 A1* | 5/2008 | Chou et al. | 257/686 |

* cited by examiner

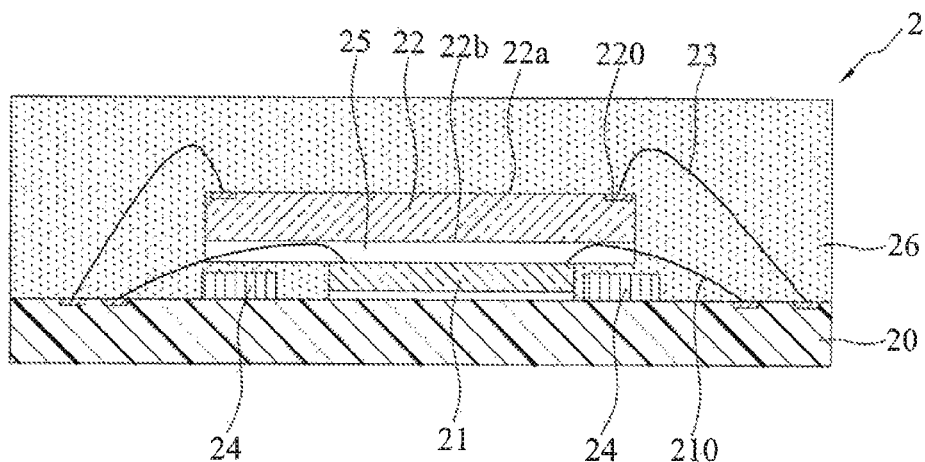
FIG.2D
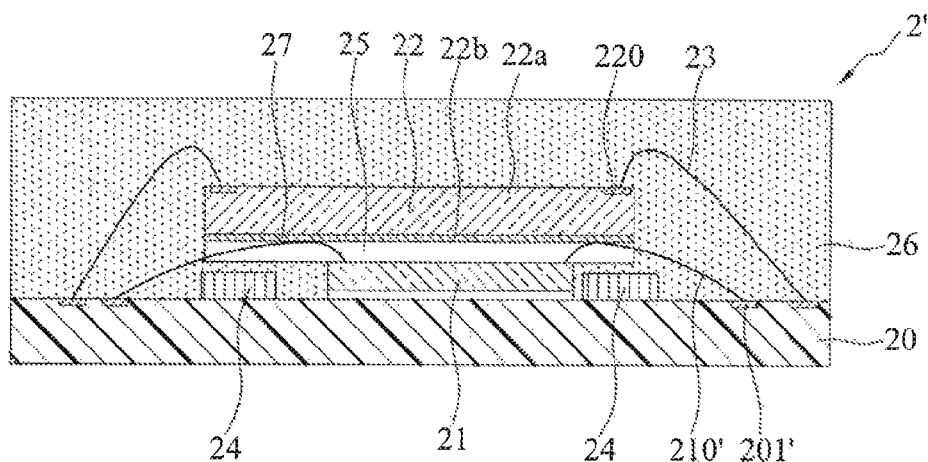
FIG.2D'
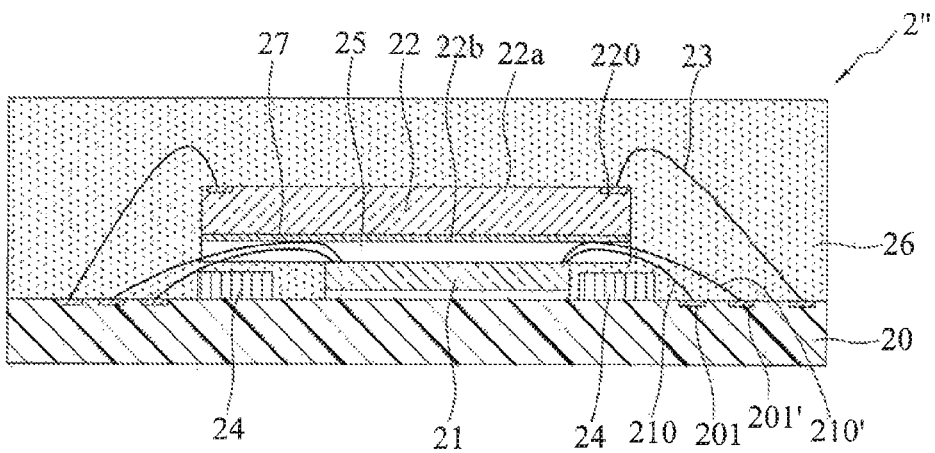
FIG.2D"

SEMICONDUCTOR PACKAGE AND FABRICATION METHOD THEREOF

CROSS-REFERENCES TO RELATED APPLICATIONS

This application claims under 35 U.S.C.§119(a) the benefit of Taiwanese Application No. 102118734, filed May 28, 2013, the entire contents of which is incorporated herein by Reference.

BACKGROUND OF THE INVENTION

1. Field of the Invention

The present invention relates to semiconductor packages and fabrication methods thereof and more particularly, to a semiconductor package and a fabrication method thereof for improving the product reliability.

2. Description of Related Art

With the rapid development of electronic industries, electronic products are developed towards miniaturization, light weight and high speed processing. Radio frequency (RF) chips are required in a lot of electronic products. For the purpose of miniaturization or high speed processing, RF chips are usually integrated with digital integrated circuits (ICs), digital signal processors (DSPs) or baseband (BB) chips.

Currently, there are various types of chip packages. To achieve a small surface bonding area, a plurality of chips are usually disposed on a substrate in a stack manner and electrically connected to the substrate through wire bonding. To facilitate the wire bonding, the chips are disposed with their active surfaces facing upward. A dummy chip or a paste adhesive or film is disposed between two adjacent chips, thus allowing bonding wires to have sufficient wire loops.

FIG. 1 is a schematic cross-sectional view of a conventional semiconductor package 1. Referring to FIG. 1, the semiconductor package 1 has a circuit board 10, an RF chip 12 disposed on the circuit board 10, a dummy chip 11 disposed on the RF chip 12, a semiconductor chip 14 disposed on the dummy chip 11, a plurality of first bonding wires 140 electrically connecting the semiconductor chip 14 and the circuit board 10, a plurality of second bonding wires 13 electrically connecting the RF chip 12 and the circuit board 10, and an encapsulant 16 encapsulating the dummy chip 11, the semiconductor chip 14, the first bonding wires 140, the RF chip 12 and the second bonding wires 13. Since a gap is provided between the semiconductor chip 14 and the RF chip 12 by the dummy chip 11, the second bonding wires 13 can be formed with a sufficient wire loop.

However, RF circuits of the RF chip 12 form a sensitive area easily affected by such as interferences and thermal factors, especially when the RF chip 12 is a high frequency chip or a wireless RF chip. As such, the flexibility of wiring and element arrangement is reduced and it becomes quite difficult to achieve a highly integrated wireless system in package (SiP) module.

Further, signals from the RF chip 12 and the semiconductor chip 14 arranged in a stack manner may interfere with each other and generate noises, especially when the RF chip 12 is a high frequency chip or a wireless RF chip, thereby seriously affecting operation of the semiconductor chip 14.

Therefore, there is a need to provide a semiconductor package and a fabrication method thereof so as to overcome the above-described drawbacks.

SUMMARY OF THE INVENTION

In view of the above-described drawbacks, the present invention provides a semiconductor package, which comprises: a circuit board; a carrier disposed on the circuit board; an RF chip disposed on the carrier, wherein the RF chip has an active surface with a plurality of electrode pads and an inactive surface opposite to the active surface, and the RF chip is disposed on the carrier via the inactive surface thereof; a plurality of high level bonding wires electrically connecting the electrode pads of the RF chip and the circuit board; and an encapsulant formed on the circuit board for encapsulating the carrier, the high level bonding wires and the RF chip.

The present invention further provides a fabrication method of a semiconductor package, which comprises the steps of: providing a circuit board having a carrier thereon; disposing an RF chip on the carrier, wherein the RF chip has an active surface with a plurality of electrode pads and an inactive surface opposite to the active surface, and the RF chip is disposed on the carrier via the inactive surface thereof; forming a plurality of high level bonding wires electrically connecting the electrode pads of the RF chip and the circuit board; and forming an encapsulant on the circuit board for encapsulating the carrier, the high level bonding wires and the RF chip.

In the above-described package and method, the carrier can be a functional chip, a dummy chip, a heat sink or an insulator.

In the above-described package and method, the RF chip can be greater in width than the carrier so as to form a receiving space between the RF chip and the circuit board. At least a semiconductor element can be disposed on the circuit board in a manner that the semiconductor element is received in the receiving space or located at a periphery of the carrier.

In the above-described package and method, the RF chip can be attached to the carrier through a bonding layer.

In the above-described package and method, a plurality of low level bonding wires can further be formed to connect the carrier and the circuit board, and the RF chip can be attached to the carrier through a bonding layer that partially encapsulates the low level bonding wires. In an embodiment, the low level bonding wires electrically connect the carrier and the circuit board. In another embodiment, the RF chip has a grounding layer formed on the inactive surface thereof, and the low level bonding wires are in contact with the grounding layer so as to ground the carrier to the circuit board.

According to the present invention, the RF chip is positioned at a high level and spaced from the circuit board to facilitate element arrangement and high frequency wiring on the circuit board, thus achieving a highly integrated wireless SiP (System in Package) module.

BRIEF DESCRIPTION OF DRAWINGS

FIGS. 2A to 2D are schematic cross-sectional views showing a fabrication method of a semiconductor package according to the present invention, wherein FIG. 2C' shows an embodiment of FIG. 2C, and FIGS. 2D' and 2D" show other embodiments of FIG. 2D.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "first", "on", "high level", "low level", "a" etc. are merely for illustrative purposes and should not be construed to limit the scope of the present invention.

FIGS. 2A to 2D are schematic cross-sectional views showing a fabrication method of a semiconductor package 2 according to the present invention.

Figure 1:
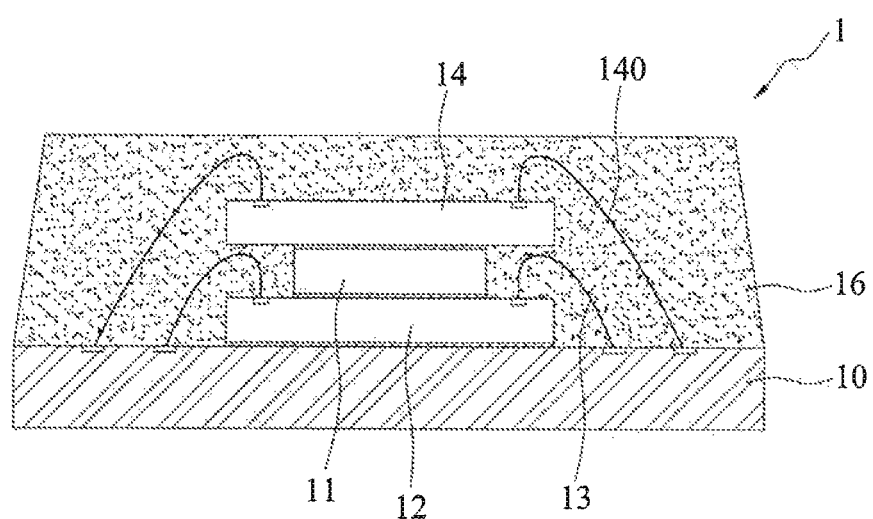
FIG. 1 is a schematic cross-sectional view of a conventional semiconductor package.
Figure 2A:
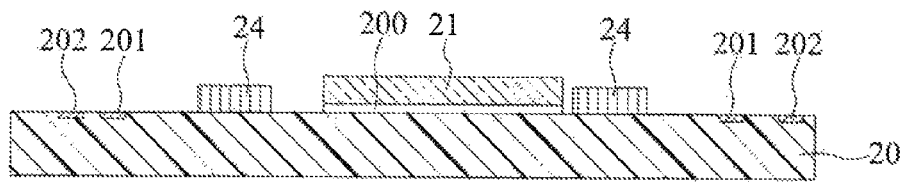

Referring to FIG. 2A, a circuit board 20 having a carrier 21 thereon is provided. A plurality of semiconductor elements 24 are disposed on the circuit board 20.

In the present embodiment, the circuit board 20 has a plurality of first bonding pads 201 and a plurality of second bonding pads 202. The carrier 21 is attached to the circuit board 20 through an adhesive layer 200.

The carrier 21 can be a functional chip, a dummy chip, a heat sink or an insulator.

The semiconductor elements 24 can be resistors, capacitors or inductors and are located around a periphery of the carrier 21.

Figure 2B:
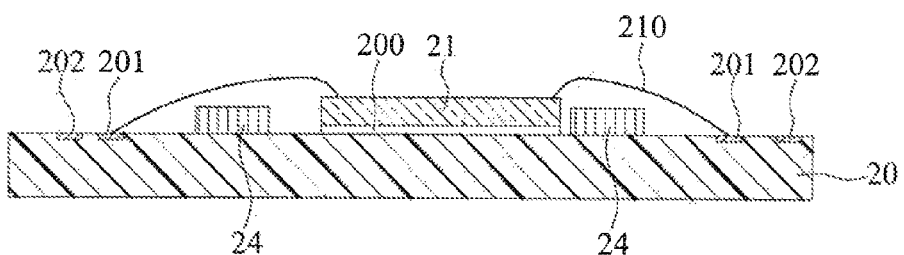

Referring to FIG. 2B, a plurality of low level bonding wires 210 are formed to electrically connect the carrier 21 and the first bonding pads 201 of the circuit board 20.

Figure 2C:
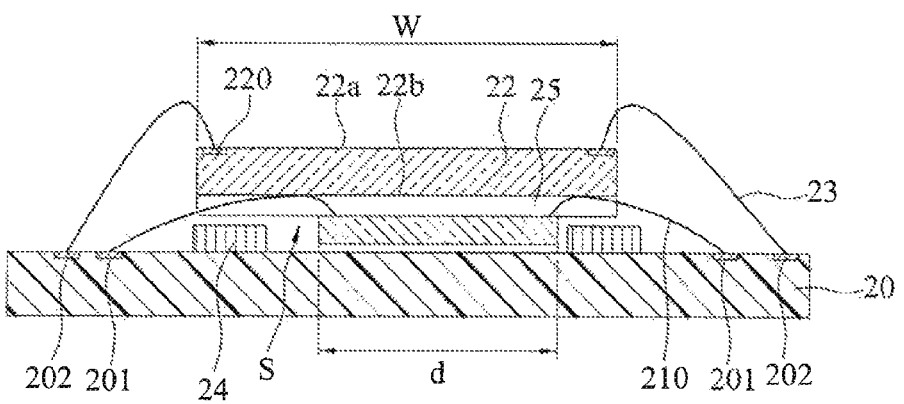
Figure 2C:
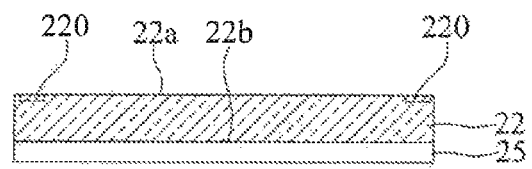

Referring to FIG. 2C, an RF chip 22 is disposed on the carrier 21. The RF chip 22 has an active surface 22a with a plurality of electrode pads 220 and an inactive surface 22b opposite to the active surface 22a. The RF chip 22 is disposed on the carrier 21 via the inactive surface 22b thereof.

Then, a plurality of high level bonding wires 23 are formed to electrically connect the electrode pads 220 of the RF chip 22 and the second bonding pads 202 of the circuit board 20.

In the present embodiment, the RF chip 22 is a high frequency chip or a wireless RF chip. The width W of the RF chip 22 is greater than the width d of the carrier 21. As such, a receiving space S is formed between the RF chip 22 and the circuit board 20 and the semiconductor elements 24 are received in the receiving space S. The receiving space S has a height of at least 0.2 mm.

Further, the RF chip 22 is attached to the carrier 21 through a bonding layer 25. By using a film over wire (FOW) technique the low level bonding wires 210 are partially encapsulated by the bonding layer 25. As such, the low level bonding wires 210 are prevented from crossing or coming into contact with the RF chip 22, thus preventing short circuits and facilitating wire bonding. In addition, such a structure meets the miniaturization requirement of semiconductor packages.

Referring to FIG. 2C', the bonding layer 25 is formed on the inactive surface 22b of the RF chip 22 first and then the RF chip 22 is attached to the carrier 21 through the bonding layer 25. In an alternative embodiment, the bonding layer 25 is formed on the carrier 21 and then the RF chip 22 is attached to the bonding layer 25 of the carrier 21 via the inactive surface 22b thereof.

Referring to FIG. 2D, an encapsulant 26 is formed on the circuit board 20 for encapsulating the carrier 21, the RF chip 22, the low level bonding wires 210 and the high level bonding wires 23.

In the present embodiment, the encapsulant 26 is made of a molding compound and formed through a molding process. In other embodiments, the encapsulant 26 can be made of a thin film and formed through lamination, or made of an adhesive and formed through printing.

According to the present invention, the RF chip 22 is positioned at a suitable high level so as to form the receiving space S between the RF chip 22 and the circuit board 20, thereby facilitating arrangement of elements, such as the semiconductor element 24, and high frequency wiring on the circuit board 20 and hence increasing the flexibility of wiring and element arrangement. Therefore, a highly integrated wireless SiP module can be achieved.

Further, by positioning the RF chip 22 at a suitable high level, the present invention prevents interference of the RF chip 22 with the semiconductor element 24 or circuits of the circuit board 20.

In another embodiment, referring to FIG. 2D', a grounding layer 27 is formed on the inactive surface 22b of the RF chip 22, and the low level bonding wires 210' are in contact with the grounding layer 27 so as to ground the carrier 21 to the first bonding pads 201'. As such, the carrier 21 does not have an electrical function.

In another embodiment, referring to FIG. 2D", the carrier 21 is grounded to the first bonding pads 201' through a portion of the low level bonding wires 210' and electrically connected to the first bonding pads 201 through another portion of the low level bonding wires 210. As such, the carrier 21 has an electrical function.

The present invention further provides a semiconductor package 2, 2', 2", which has: a circuit board 20; a carrier 21 disposed on the circuit board 20; an RF chip 22 disposed on the carrier 21, wherein the RF chip 22 has an active surface 22a with a plurality of electrode pads 220 and an inactive surface 22b opposite to the active surface 22a, and the RF chip 22 is disposed on the carrier 21 via the inactive surface 22b thereof; a plurality of high level bonding wires 23 electrically connecting the electrode pads 220 of the RF chip 22 and the circuit board 20; and an encapsulant 26 formed on the circuit board 20 for encapsulating the carrier 21, the high level bonding wires 23 and the RF chip 22.

The carrier 21 can be a functional chip, a dummy chip, a heat sink or an insulator.

The width W of the RF chip 22 can be greater than the width d of the carrier 21 so as to form a receiving space S between the RF chip 22 and the circuit board 20. Further, at least a semiconductor element 24 can be disposed on the circuit board 20 and received in the receiving space S or located a periphery of the carrier 21.

The RF chip 22 can be attached to the carrier 21 through a bonding layer 25, a plurality of low level bonding wires 210 can be formed to electrically connect the carrier 21 and the circuit board 20, and the low level bonding wires 210 can be partially encapsulated by the bonding layer 25.

In an embodiment, the RF chip 22 has a grounding layer 27 formed on the inactive surface 22b thereof, and the low level bonding wires 210' are in contact with the grounding layer 27 so as to ground the carrier 21 to the circuit board 20. In an alternative embodiment, the carrier 21 can be grounded to the circuit board 20 through a portion of the low level bonding wires 210' and electrically connected to the circuit board 20 through another portion of the low level bonding wires 210.

Therefore, the present invention positions the RF chip at a high level to facilitate element arrangement and high frequency wiring so as to achieve a highly integrated wireless SiP module.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A semiconductor package, comprising:
a circuit board;
a carrier disposed on the circuit board;
an RF chip disposed on the carrier, wherein the RF chip has an active surface with a plurality of electrode pads and an inactive surface opposite to the active surface, and the RF chip is disposed on the carrier via the inactive surface thereof through a bonding layer, wherein the RF chip is greater in width than the carrier so as to form a receiving space between the RF chip and the circuit board;
a grounding layer formed on the inactive surface of the RF chip and between the bonding layer and the inactive surface of the RF chip, wherein the grounding layer is free from being in direct contact with the carrier;
a plurality of low level bonding wires connecting the carrier and the circuit board, wherein a portion of the low level bonding wires is in direct contact with the grounding layer, and the bonding layer partially encapsulates the low level bonding wires;
at least a semiconductor element disposed on the circuit board and received in the receiving space, wherein the semiconductor element is located at a periphery of the carrier such that the RF chip covers the semiconductor element;
a plurality of high level bonding wires electrically connecting the electrode pads of the RF chip and the circuit board; and
an encapsulant formed on the circuit board for encapsulating the carrier, the high level bonding wires, the semiconductor element, and the RF chip.

2. The package of claim 1, wherein the carrier is a functional chip, a dummy chip, a heat sink or an insulator.

3. The package of claim 1, further comprising at least another semiconductor element disposed on the circuit board.

4. The package of claim 1, wherein the low level bonding wires electrically connect the carrier and the circuit board.

5. The package of claim 1, wherein the carrier is grounded to the circuit board through a portion of the low level bonding wires and electrically connected to the circuit board through another portion of the low level bonding wires.

6. The package of claim 1, wherein the carrier is grounded to the circuit board through the portion of the low level bonding wires and electrically connected to the circuit board through another portion of the low level bonding wires.

7. A fabrication method of a semiconductor package, comprising the steps of:
providing a circuit board having a carrier thereon;
forming a plurality of low level bonding wires connecting the carrier and the circuit board;
disposing an RF chip on the carrier, wherein the RF chip has an active surface with a plurality of electrode pads and an inactive surface opposite to the active surface, and the RF chip is disposed on the carrier via the inactive surface thereof through a bonding layer, wherein the bonding layer partially encapsulates the low level bonding wires, wherein the RF chip is greater in width than the carrier so as to form a receiving space between the RF chip and the circuit board, and wherein a grounding layer is formed on the inactive surface of the RF chip and between the bonding layer and the inactive surface of the RF chip, wherein the grounding layer is free from being in direct contact with the carrier, and a portion of the low level bonding wires is in direct contact with the grounding layer;
disposing at least a semiconductor element on the circuit board in a manner that the semiconductor element is received in the receiving space, wherein the semiconductor element is located at a periphery of the carrier such that the RF chip covers the semiconductor element;
forming a plurality of high level bonding wires electrically connecting the electrode pads of the RF chip and the circuit board; and
forming an encapsulant on the circuit board for encapsulating the carrier, the high level bonding wires, the semiconductor element, and the RF chip.

8. The method of claim 7, wherein the carrier is a functional chip, a dummy chip, a heat sink or an insulator.

9. The method of claim 7, further comprising disposing at least another semiconductor element on the circuit board.

10. The method of claim 7, wherein the low level bonding wires electrically connect the carrier and the circuit board.

11. The method of claim 7, wherein the carrier is grounded to the circuit board through the portion of the low level bonding wires and electrically connected to the circuit board through another portion of the low level bonding wires.

* * * * *